US006864672B2

(12) United States Patent
Bogdan

(10) Patent No.: US 6,864,672 B2
(45) Date of Patent: Mar. 8, 2005

(54) HIGH RESOLUTION PHASE FREQUENCY DETECTORS

(76) Inventor: John W. Bogdan, 1210 Major Str., Ottawa On (CA), K2C 2S2

(*) Notice: Subject to any disclaimer, the term of this patent is extended or adjusted under 35 U.S.C. 154(b) by 260 days.

(21) Appl. No.: 10/031,359
(22) PCT Filed: May 24, 2001
(86) PCT No.: PCT/CA01/00723
§ 371 (c)(1),
(2), (4) Date: Jan. 18, 2002
(87) PCT Pub. No.: WO01/91297
PCT Pub. Date: Nov. 29, 2001

(65) Prior Publication Data
US 2002/0150191 A1 Oct. 17, 2002

Related U.S. Application Data
(60) Provisional application No. 60/206,579, filed on May 24, 2000.

(51) Int. Cl.[7] ............ G01R 23/00; H03D 3/24
(52) U.S. Cl. .................. 324/76.52; 375/375
(58) Field of Search ............. 702/72, 74, 78, 702/79, 106, 178; 327/2, 147, 159–160; 324/76.52, 76.55, 76.62, 76.77, 76.82; 375/375, 224, 226

(56) References Cited

U.S. PATENT DOCUMENTS 4,316,152 A * 2/1982 Meyer .................. 331/1 A
6,148,052 A * 11/2000 Bogdan .................. 375/375

* cited by examiner

Primary Examiner—Anjan Deb
Assistant Examiner—Amy He
(74) Attorney, Agent, or Firm—John W. Bogdan

(57) ABSTRACT

An inexpensive and reliable, high resolution digital phase detector for timing circuits for wireless, optical or wire-line transmission systems. In particular this invention allows using size limited clock counters for measurements of unlimited time ranges by combining unlimited number of intermediate samples without accumulating samples granularity errors. In addition to the measurements of the final time ranges, the intermediate samples are available for purposes of digital signal processing.

39 Claims, 12 Drawing Sheets

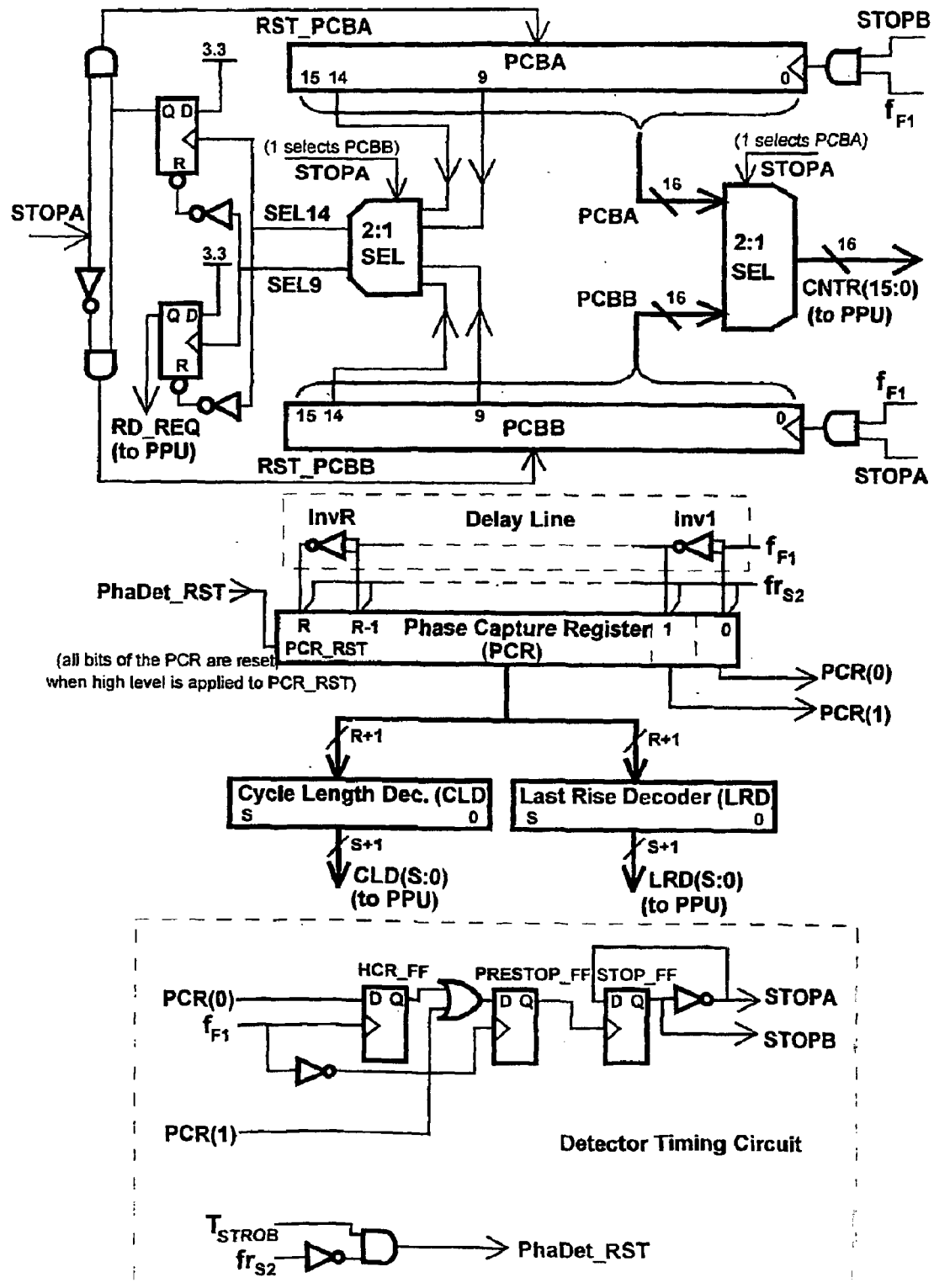
FIG.1 Circuits of HRPD Config. 1

FIG.2 Timing Analysis of HRPD Config.1
For PCR(0)=1:
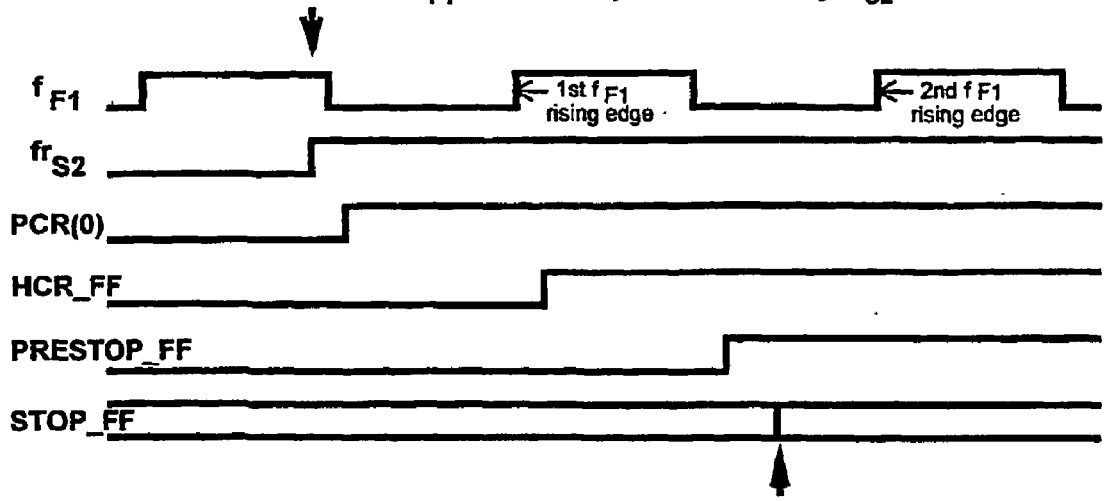
For PCR(1)=1:
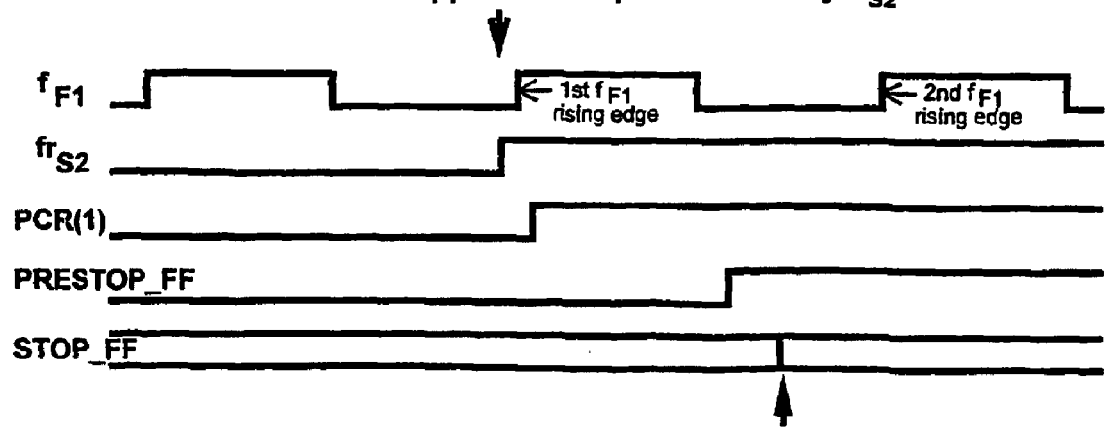

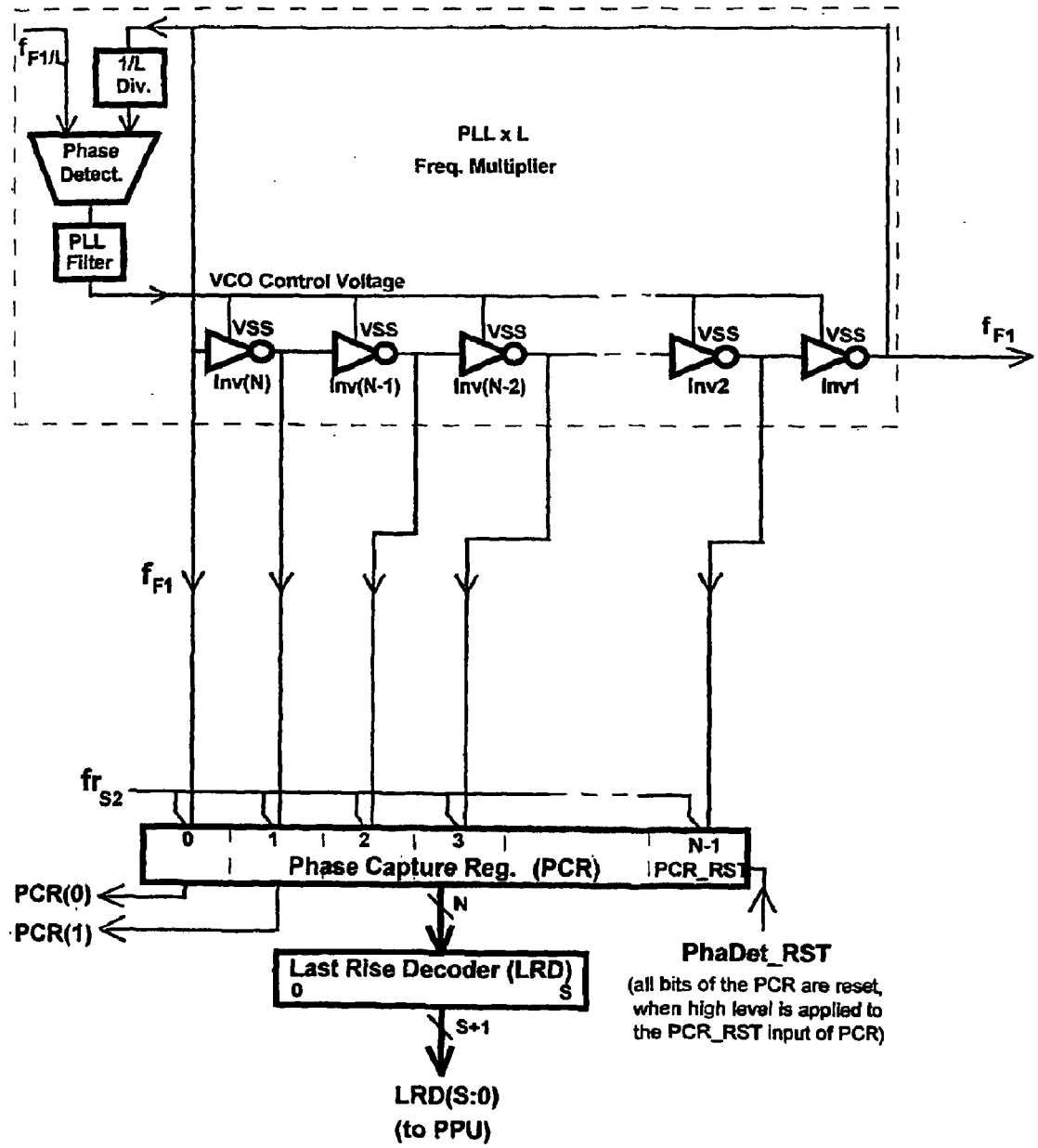
Fig.3 High Resolution Extension of the HRPD Config.2

Fig.4 High Resolution Extension of the HRPD Config.3
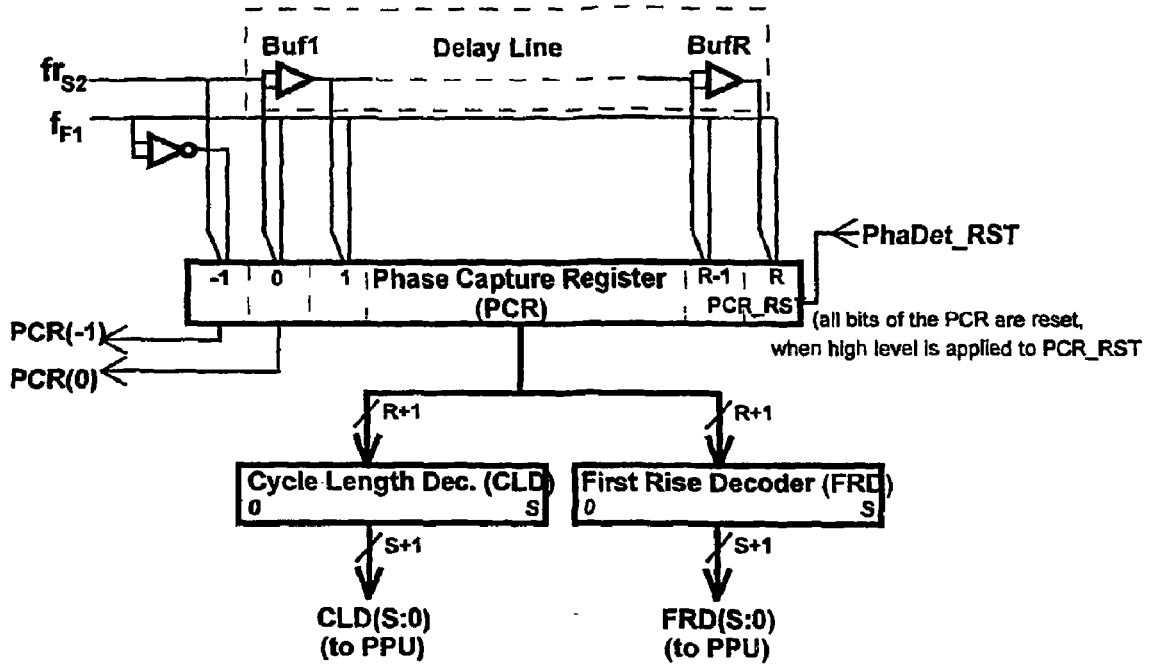
Fig.5 Detector Timing Circuit of the HRPD Config.3
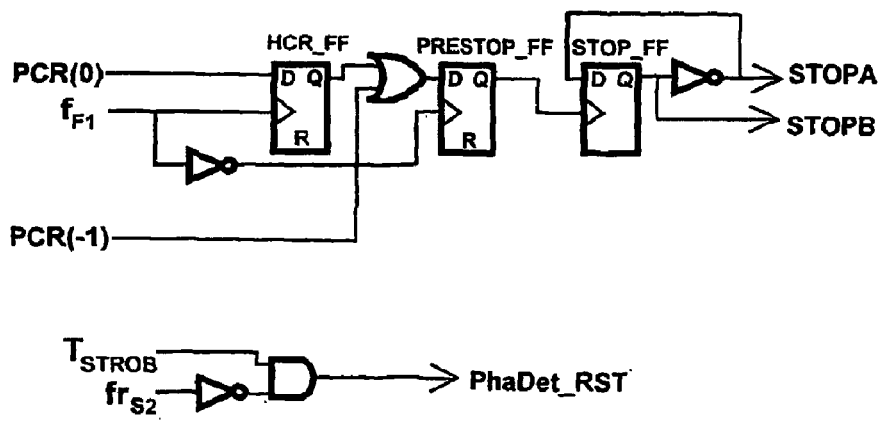

FIG.6 Timing Analysis of the HRPD Config.3
For PCR(0)=1:
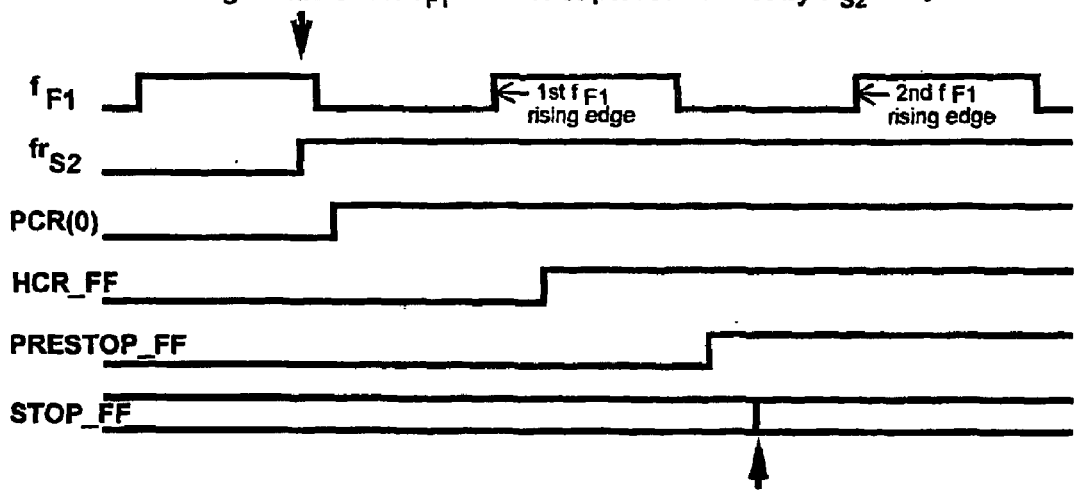
For PCR(-1)=1:
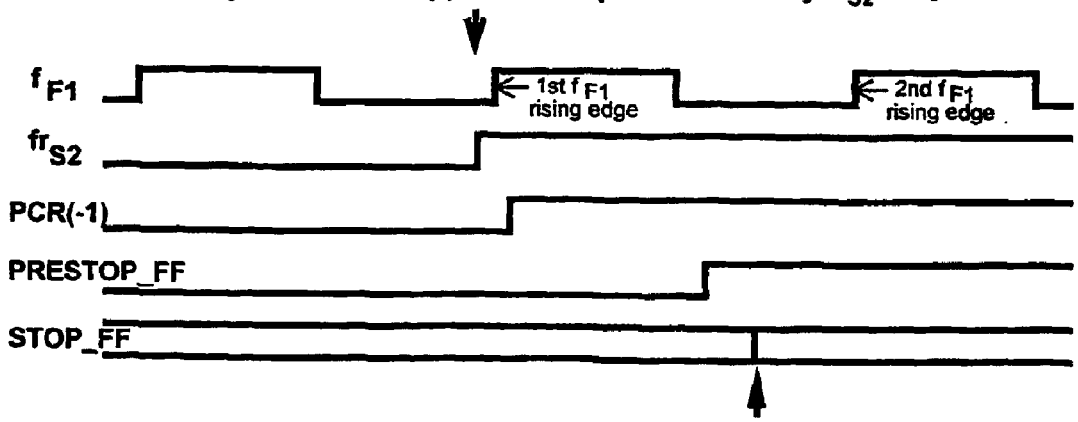

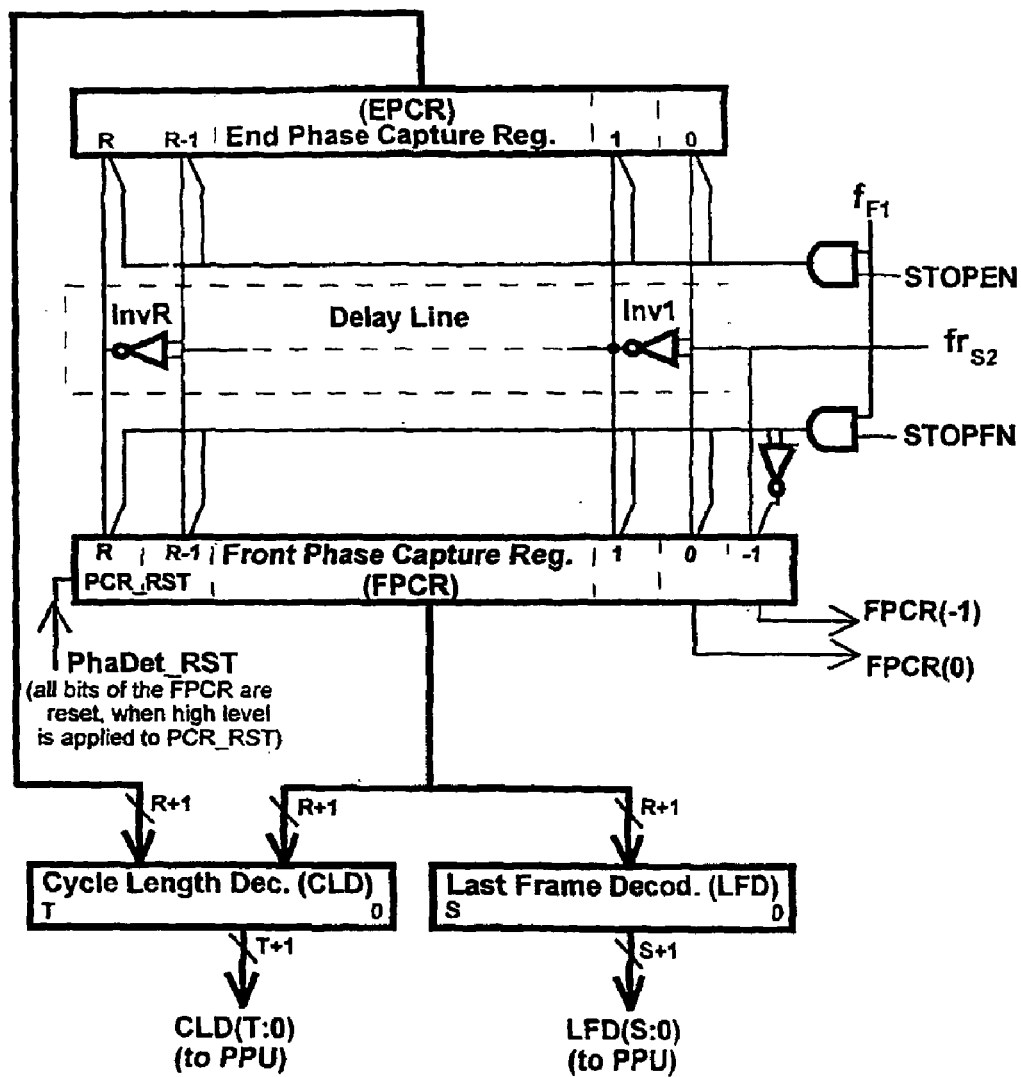
Fig.7 High Resolution Extension of the HRPD Config.4

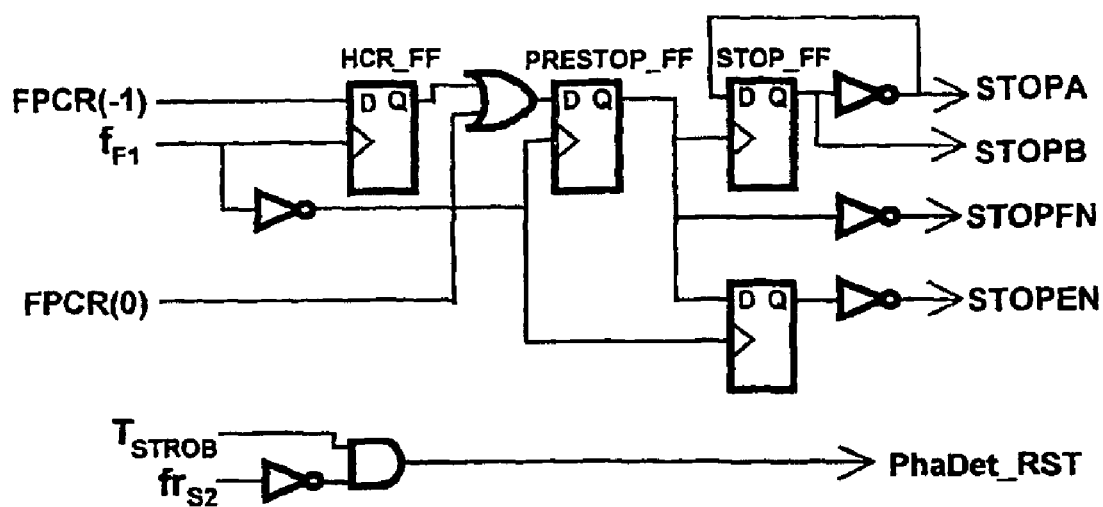
Fig.8 Detector Timing Circuit of the HRPD Config.4

FIG.9 Timing Analysis of the HRPD Config.4
For FPCR(-1)=1:
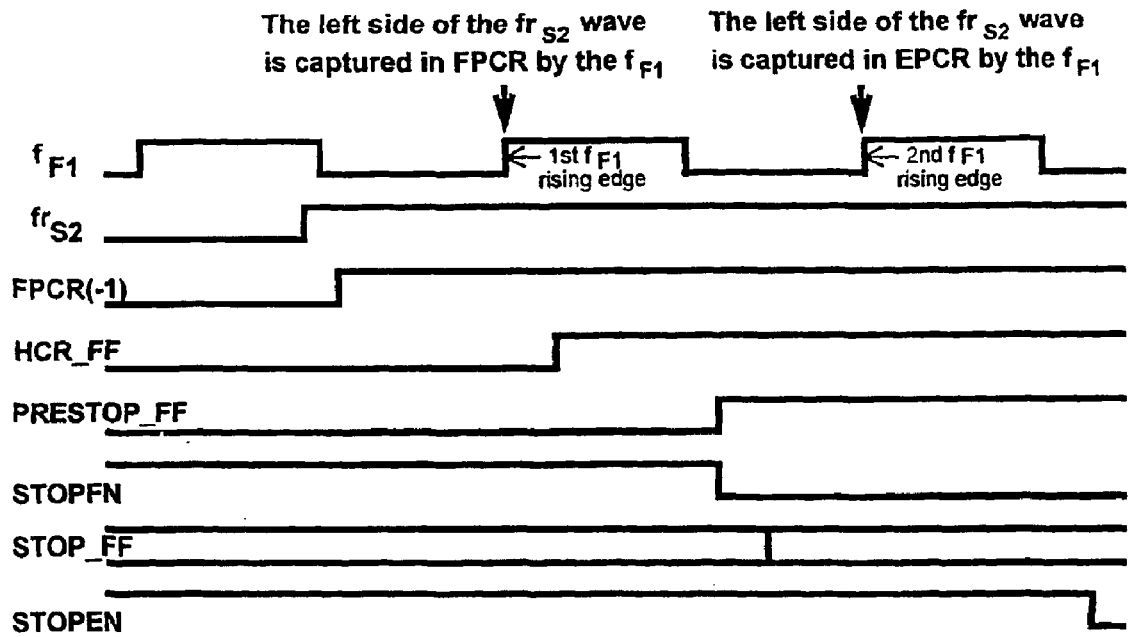
For FPCR(0)=1:
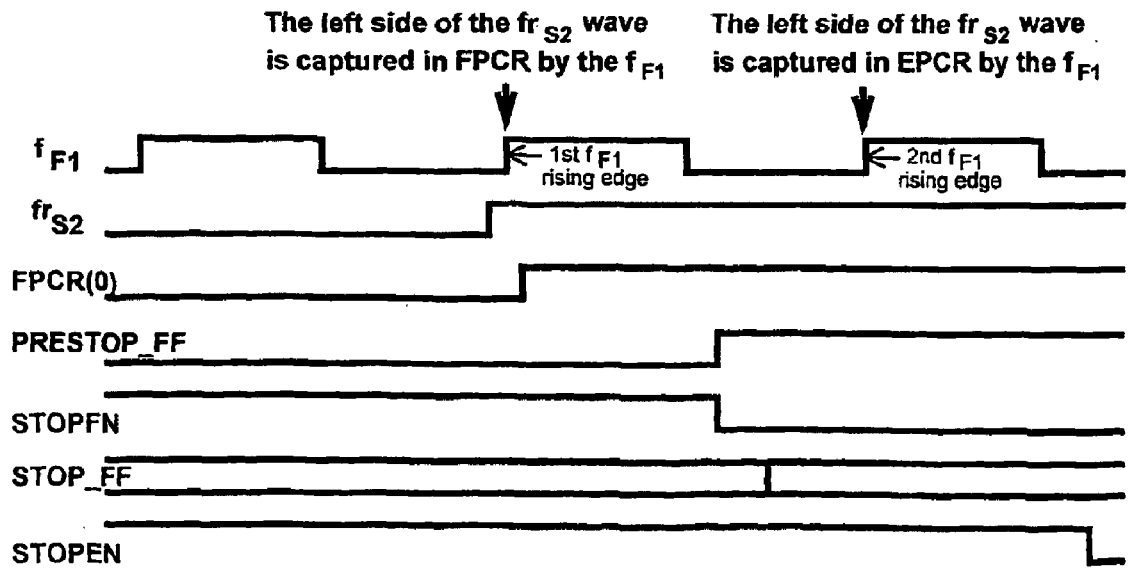

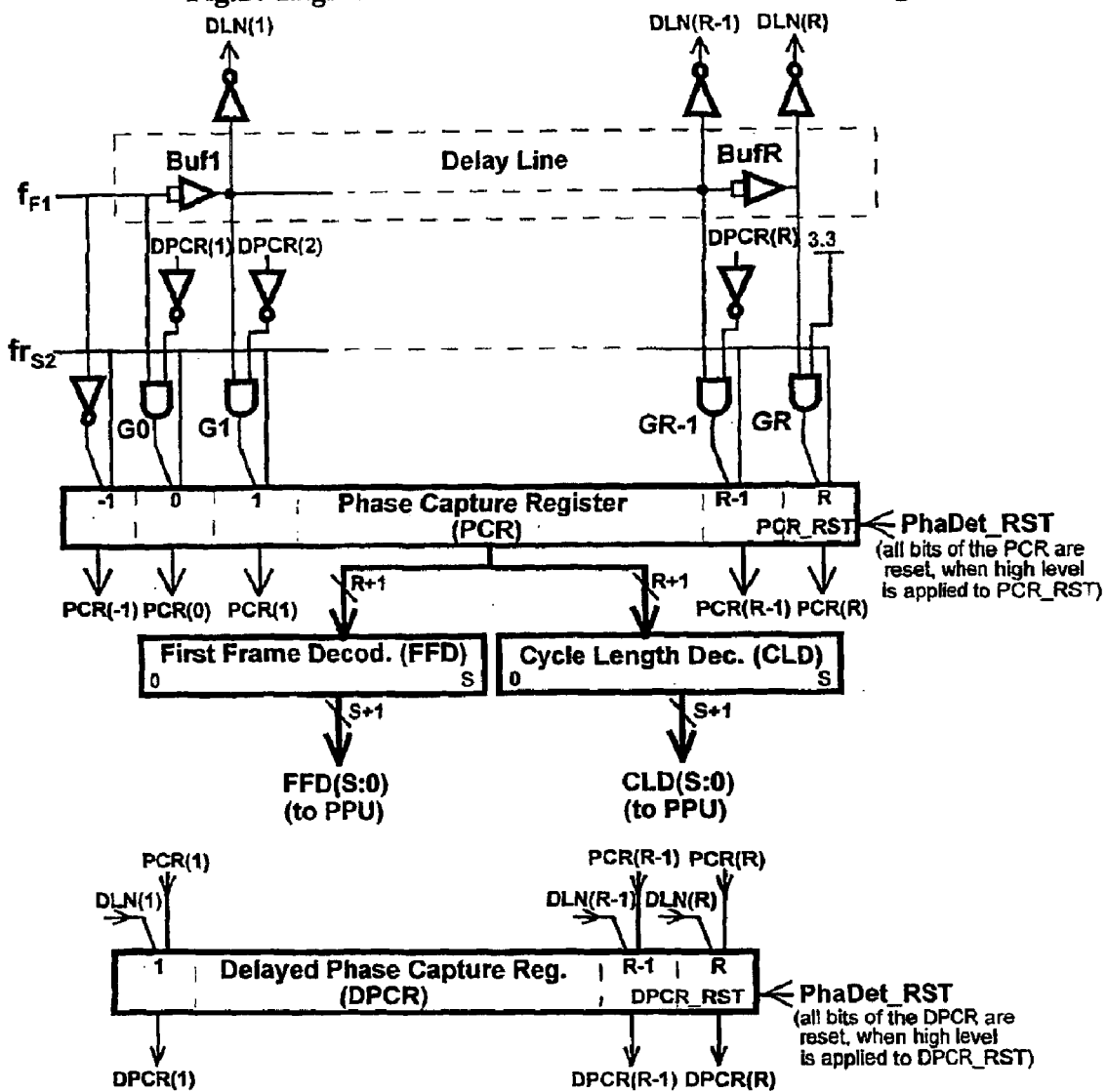
Fig.10 High Resolution Extension of the HRPD Config.5
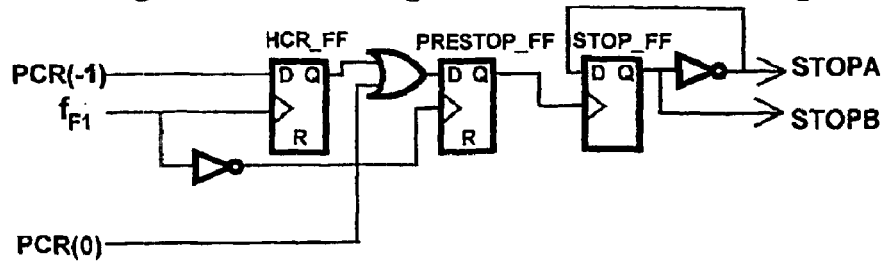
Fig.11 Detector Timing Circuit of the HRPD Config.5

FIG.12 Timing Analysis of the HRPD Config.5
For PCR(-1)=1:
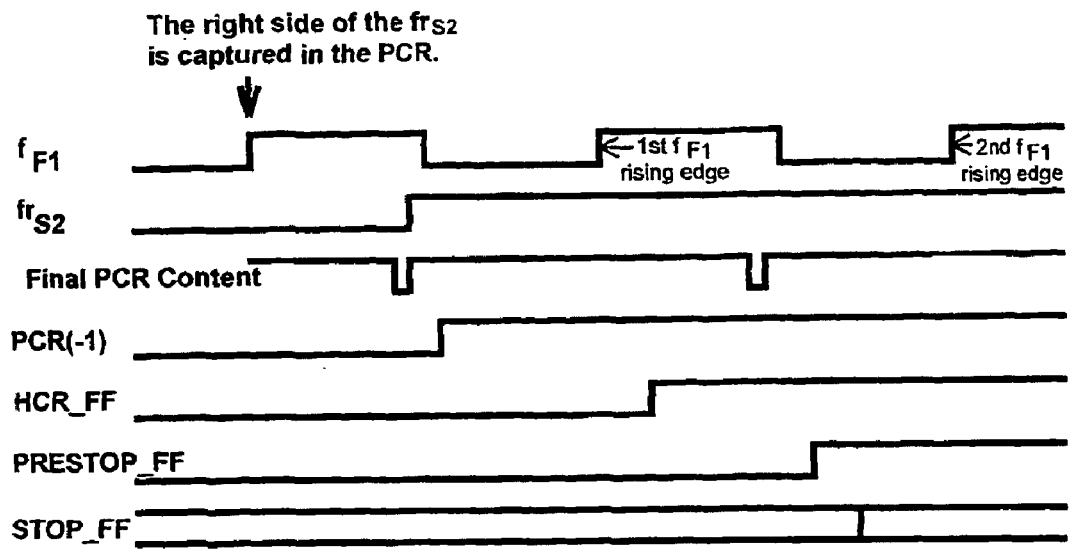
For PCR(0)=1:
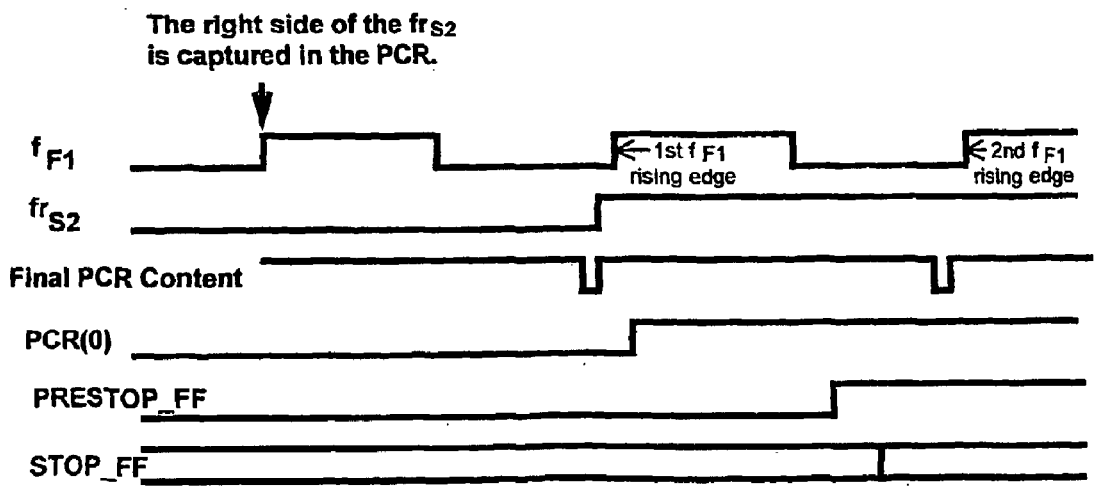

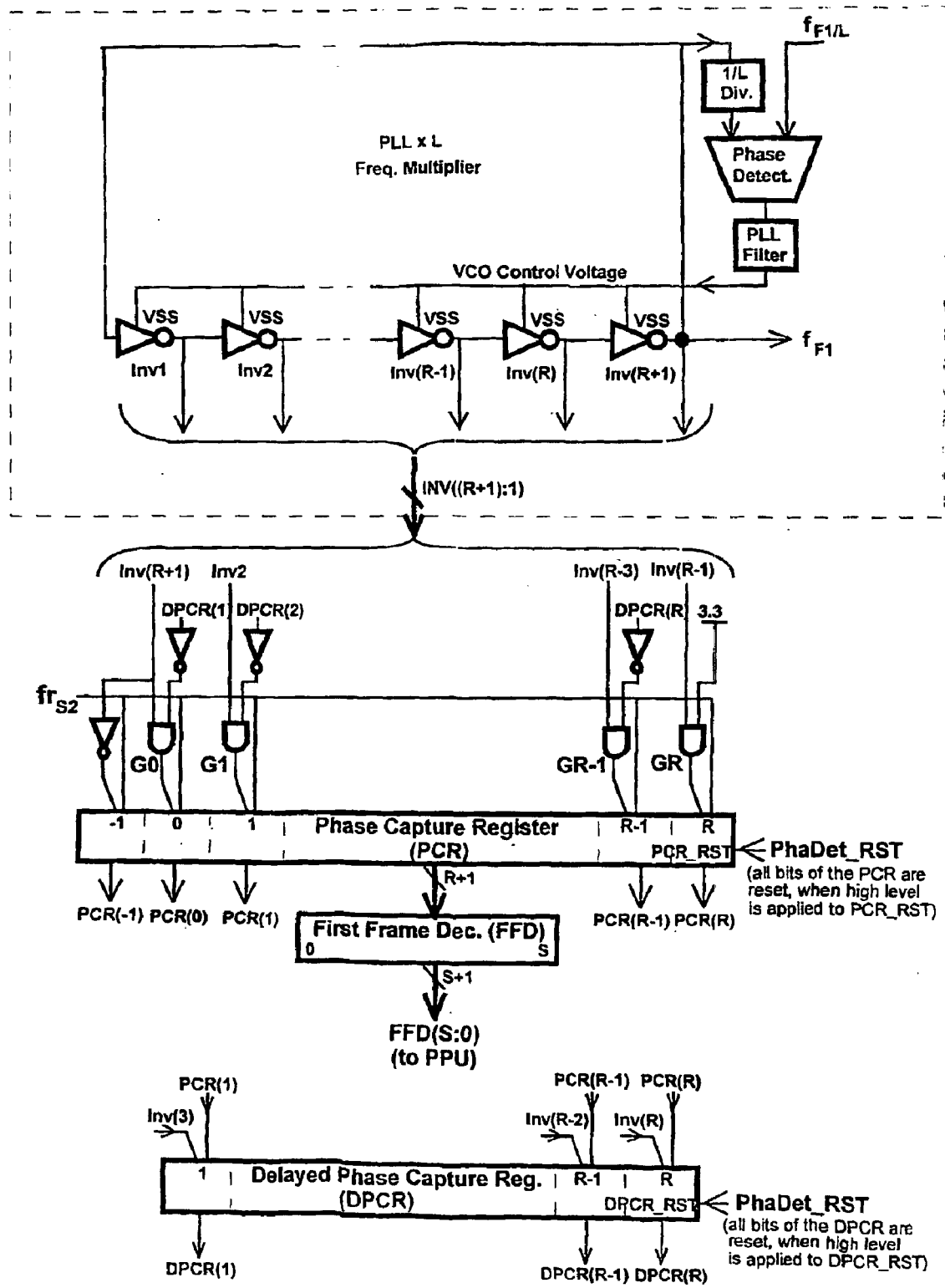
Fig.13 High Resolution Extension of the HRPD Config.6

FIG.14 Timing Analysis of the HRPD Config.6
For PCR(-1)=1:
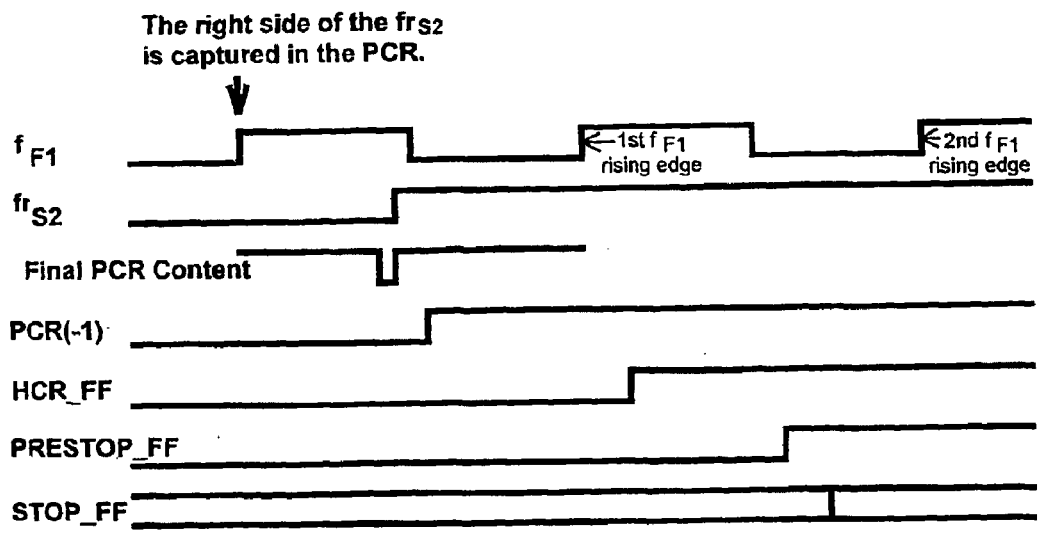
For PCR(0)=1:
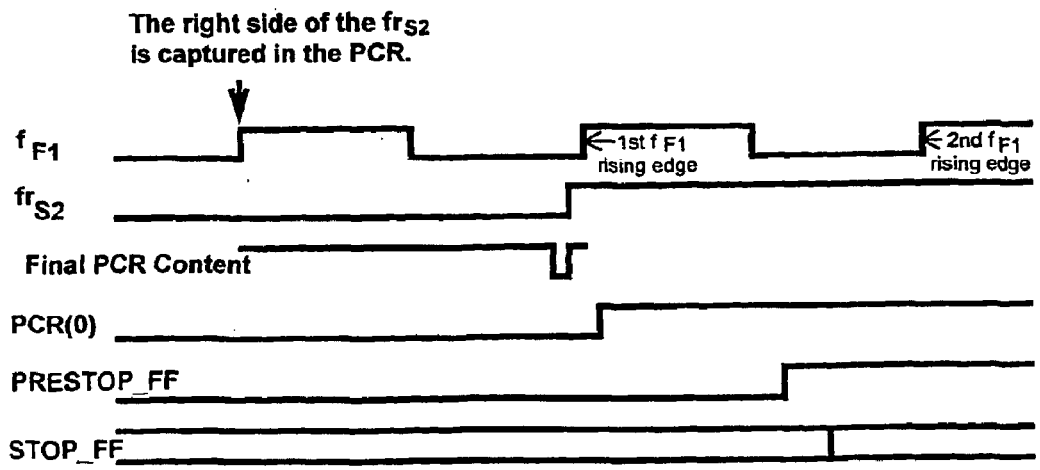

HIGH RESOLUTION PHASE FREQUENCY DETECTORS

This application is a 371 of PCT/CA01/00723 filed May 24, 2001 and claims benefit of provisional application 60/206,579 filed May 24, 2000.

BACKGROUND OF THE INVENTION

1. Field of the Invention

This invention is directed to providing high resolution low cost digital phase detectors which can be used in digital phase locked loops (DPLLs) and shall also make possible other replacements of analog circuits by their digital implementations.

The high resolution phase detectors (HRPD) can be used for a wide range of data rates, and for wireless, optical, or wireline transmission and communication systems.

2. Background Art

Most of currently used digital phase detectors have resolution limited by a clock cycle time. While some most advanced digital phase detectors allow higher resolutions which are comparable with propagation delays of clock propagating gates, they have other limitations such as: complex algorithms which are conditioned by propagation delays of detector timing circuits, and dependency of their phase resolution on technological process and power supply variations.

The closest background solution is presented by Bogdan (U.S. Pat. No. 6,148,052). However this background solution requires additional oscillator circuit implemented with free running ring oscillator having unknown oscillation frequencies dependent on IC process deviations and power supply variations causing propagation delays deviations ranging from −50% to +50%.

Outputs of such additional unpredictable oscillator circuit are used to capture a phase of a first signal frame and a phase of a second signal frame, which need to be subtracted from each other to calculate a phase skew between the first signal frame and the second signal frame. Therefore in addition to the oscillator circuit, said background solution requires:

- separate circuits for capturing first signal phase with oscillator outputs while other circuits are used for capturing second signal phase with the oscillator outputs;
- additional circuits for subtracting such separately captured first signal phase from second signal phase;
- oscillator calibration circuits for counting and capturing oscillator outputs over a predetermined fixed time period;
- control unit circuits and subroutines for processing and using the above calibration results for recalculating the above mentioned inter-signal phase skews.

There is a need for digital phase detectors which have simpler algorithms and greater independence versus the propagation delays of the detector timing circuits and the clock propagating gates.

Such much simpler digital phase detectors are provided by the present invention which eliminates the additional free running oscillator and the above mentioned additional circuits and calibration related subroutines. These improvements are achieved by changing principle of operation, as the present invention:

Propagates the first signal clock through serially connected gates and uses outputs of these gates for sensing phase of the second signal or propagates the second signal through serially connected gates and uses outputs of these gates for sensing phase of the first signal clock, instead of using outputs of the additional free running oscillator for capturing phases of the first signal and the second signal.

Since the first signal and the second signal are much more stable than the free running oscillator; the above calibration circuits are replaced by much simpler self-calibration means or by stabilizing propagation delays of the serially connected gates with phase locked loops or with delay locked loops.

BRIEF SUMMARY OF THE INVENTION

It is an object of present invention to provide digital high resolution phase detectors which are simple and reliable and can be used in variety of communication systems.

Variety of the high resolution phase detectors are described in this document using the same terms which are explained below.

First signal clock $f_{F1}$ is a higher frequency signal which is used to measure time periods corresponding to single or multiple cycles of a lower frequency signal which is called second signal frame $fr_{S2}$.

High resolution phase detectors comprise:
- a counter and a buffer configuration for counting the first signal clock during every frame of a second signal, and for buffering the counted value until it is read by a phase processing unit;
- a high resolution extension of the counter and buffer configuration, which measures a remainder of a frame phase skew which is lesser than one clock cycle;
- a detector timing circuit for synchronizing the clock counting and the buffer reading versus the signal frame related phase capture into a phase capture register;
- a high resolution phase processing method for combining contents of the clock counter and the phase capture register into a high resolution phase measurement.

The high resolution extension can be implemented by using a propagation circuit and a phase capture register, as it is explained below.

The first signal clock or the measured second signal frame is propagated through multiple serially connected gates.

The first signal clock or the second signal frame is captured in the phase capture register by the outputs of the serially connected gates, or the outputs of the serially connected gates are captured in the phase capture register by the first signal clock or by the second signal frame. The content of the phase capture register is used to calculate a phase skew of the second signal frame versus the first signal clock.

The high resolution phase processing method comprises:
- a calculation of an approximate phase error between the first signal and the second signal, by subtracting a number of first signal clock cycles which corresponds to zero phase skew of the second signal frame, from a last number of clock cycles which has been read from the buffer;
- a calculation of a high resolution phase error by adding the high resolution extension to the approximate phase error;
- elimination of phase error accumulations for multiple measurements, by subtracting last high resolution extension from a period of the first signal clock, and by adding the resulting remainder of the clock cycle to an adjacent phase error measurement.

The above methods allow designing multiple different implementations of HRPD.

Some of these HRPD implementations are defined in the GENERAL DESCRIPTION OF THE INVENTION and are shown with more details in the DESCRIPTION OF THE PREFERRED EMBODIMENTS.

BRIEF DESCRIPTION OF THE DRAWINGS

HRPD implementation and preferred embodiments of the invention will now be described with reference to attached drawings in which:

FIG. 1 shows Circuits of the HRPD Config.1 based on an open ended delay line captured by frame edge.

FIG. 2 shows timing analysis of the HRPD Config.1.

FIG. 3 shows High Resolution Extension of the HRPD Config.2 based on a ring oscillator captured by frame edge.

FIG. 4 shows High Resolution Extension of the HRPD Config.3 based on clock signal captured by frame delay line edges.

FIG. 5 shows Detector Timing Circuit of the HRPD Config.3, which solves most critical timing of the HRPD Config.3.

FIG. 6 shows Timing Analysis of the HRPD Config.3.

FIG. 7 shows High Resolution Extension of the HRPD Config.4 based on frame delay line captured by clock signal.

FIG. 8 shows Detector Timing Circuit of the HRPD Config.4, while

FIG. 9 shows resulting Timing Analysis of the HRPD Config.4.

FIG. 10 shows High Resolution Extension of the HRPD Config.5 based on frame captured by clock delay line.

FIG. 11 shows Detector Timing Circuit of the HRPD Config.5, while

FIG. 12 shows resulting Timing Analysis of the HRPD Config.5.

FIG. 13 shows High Resolution Extension of the HRPD Config.6 based on frame captured by ring oscillator, while FIG. 14 shows resulting Timing Analysis of the HRPD Config.6.

GENERAL DESCRIPTION OF THE INVENTION

1. HRPD Config.1 based on delay line captured by frame edge

The HRPD Config.1 uses:

an open ended delay line which is built with multiple serially connected gates, which the first signal clock is continuously propagated through;

a leading edge of the second signal frame to capture a status of the outputs of the delay line in the phase capture register;

a calibration method of gates propagation delays, which is based on capturing the whole cycle of the first signal clock as it is propagated along the delay line and dividing the first signal cycle time by the number of gates which carried the whole cycle propagation.

The calibration method comprises:

statistical averaging of the calibration result, in order to eliminate most of a granularity error caused by capturing of the integer gates number and to reduce an error caused by power supply ripple.

The calibration method can further comprise a reduction of an error caused by an occurrence of different gate delays at the end versus the front of the delay line:

by assigning higher weights to the cycle gate number, if captured cycle propagating gates are located at the front of the delay line;

by using the weighted cycle gate numbers for the statistical averaging of the calibration result.

2. HRPD Config.2 based on ring oscillator captured by frame edge.

The HRPD Config.2 uses:

the signal propagation circuit which is built with multiple serially connected gates forming a ring oscillator which is phase locked to the first signal clock;

a leading edge of the second signal frame to capture a status of the outputs of the ring oscillator gates in the phase capture register.

Since the number of ring oscillator gates and the first signal clock period are known, calibration of gates propagation delay is not needed for the HRPD Config.2.

3. HRPD Config.3 based on clock signal captured by frame delay line edges.

The HRPD Config.3 uses:

the signal propagation circuit which is built with multiple serially connected gates forming an open ended delay line, which the second signal frame is continuously propagated through;

the outputs of the delay line gates to capture a waveform of the first signal clock, in the phase capture register;

a calibration method of gates propagation delays, which is based on capturing the whole cycle of the first signal clock as it occurs along the inputs of the phase capture register, and dividing the first signal cycle time by the number of the delay line gates which outputs captured the whole clock cycle.

The calibration method comprises:

statistical averaging of the calibration result, in order to eliminate most of a granularity error caused by having an integer number of the capturing gates, and to reduce an error caused by power supply ripples.

The calibration method can further comprise a reduction of an error caused by an occurrence of different gate delays at the end versus the front of the delay line:

by assigning higher weights for the cycle capturing gate number, if the cycle capturing gates are located at the front of the delay line;

by using the weighted cycle gate numbers for the statistical averaging of the calibration result.

4. HRPD Config.4 based on frame delay line captured by clock signal.

The HRPD Config.4 uses:

the signal propagation circuit which is built with multiple serially connected gates forming an open ended delay line, which the second signal frame is continuously propagated through;

the outputs of the delay line gates are captured by rising edges of the first signal clock in phase capture registers;

a calibration method of gates propagation delays which is based on capturing the frame delay line by 2 consecutive first signal rises, and dividing the first signal cycle time by a difference between numbers of gate delays which were captured by the consecutive first signal rises.

The calibration method comprises:

statistical averaging of the calibration result, in order to eliminate most of a granularity error caused by capturing an integer number of the delay line gates, and to reduce an error caused by power supply ripples.

The calibration method can further comprise a reduction of an error caused by an occurrence of different gate delays at the end versus the front of the delay line:

by assigning higher weights to the cycle capturing gate number, if the cycle capturing gates are located at the front of the delay line;

by using the weighted cycle gate numbers for the statistical averaging of the calibration result 5. HRPD Config.5 based on frame captured by clock delay line.

The HRPD Config.5 uses:
the signal propagation circuit which is built with multiple serially connected gates forming an open ended delay line, which the first signal clock is continuously propagated through;
the outputs of the delay line gates to capture a rise of the second signal frame in the phase capture register;
a calibration method of gates propagation delays which is based on:
capturing a frame rising edge by two consecutive rising edges of the signal clock which occur simultaneously along the delay line;
and dividing the first signal cycle time by a number of delay line gates which existed between said clock edges when they captured simultaneously the frame rising edge in the capture register;
a capture synchronization method which prevents the next propagated clock edges from overwriting said captures of the frame rise by said two consecutive clock edges.

The calibration method comprises:
statistical averaging of the calibration result, in order to eliminate most of a granularity error caused by having an integer number of the capturing gates, and to reduce an error caused by power supply ripples.

The calibration method can further comprise a reduction of an error caused by an occurrence of different gate delays at the end versus the front of the delay line:
by assigning higher weights to the cycle capturing gate number, if the cycle capturing gates are located at the front of the delay line.
by using the weighted cycle gate numbers for the statistical averaging of the calibration result 6. HRPD Config.6 based on frame captured by ring oscillator.

The HRPD Config.6 uses:
outputs of the signal propagation circuit, which is built with multiple serially connected gates forming a ring oscillator which is phase locked to the first signal clock;
the outputs of the ring oscillator gates to capture a rise of the second signal frame in the phase capture register;
a capture synchronization method which prevents next propagated clock edges from overwriting said capture of the rise of the second signal frame.

Since the number of ring oscillator gates and the first signal clock period are known, calibration of gates propagation delay is not needed for the HRPD Config.6.

DESCRIPTION OF THE PREFERRED EMBODIMENTS

1. HRPD Config.1 based on delay line captured by frame edge

The HRPD Config.1 is shown in FIG. 1.

Approximate phase measurements are explained below.

The HRPD Config.1 uses two symmetrical phase counters buffers A/B (PCBA/PCBB), which perform reverse functions during alternative A/B cycles of the frame signal $fr_{S2}$. During the A cycle, the PCBA counts the number of incoming $f_{F1}$ clocks, but during the following B cycle the PCBA remains frozen until its content is read by a phase processing unit (PPU), and subsequently the PCBA is reset before the beginning of the next A cycle. Reversibly, the PCBB performs counting during the B cycle and is read and reset during the following A cycle.

Such symmetrical PCBA/PCBB configuration allows much more time for counters propagation by inhibiting counting long before the actual reading takes place.

Therefore, much higher frequencies of counted clocks are allowed for the same IC technology.

Generally speaking the above concept of a digital phase detector, represents one of several possible HRPD solutions, which are based on counting the first signal clock during every frame of the second signal, wherein the second signal frame contains a number of the second signal clocks.

The symmetrical twin pair PCBA/PCBB configuration:
allows higher counting speeds by eliminating all problems related to counters propagation delays.
allows measurements of $fr_{S2}$ versus $f_{F1}$ phase errors, with a resolution of a single $f_{F1}$ period.

When $fr_{S2}$ rise signals the end of the current phase measurement, counting of $f_{F1}$ clock is inhibited and the counter content remains frozen, until the next rise of the $fr_{S2}$ signal when the counted clock is enabled again. The whole $fr_{S2}$ cycle is a very long freeze period, which is more than sufficient to accommodate; any kind of counter propagation, the counter transfer to the phase processing unit, and the counter reset. During the freeze period a mate counter is kept enabled and provides measurement of $fr_{S2}$ phase.

More detailed operations of the PCBA/PCBB configuration for both alternatives STOPA=1 and STOPB=1, are further explained below.

When STOPA signal is active, HRPD circuits perform listed below functions.

The PCBB counts all rising edges of $f_{F1}$ clocks.

When PCBB(9) goes high, the PCBB generates SEL9 signal. The SEL9 activates RD_REQ which initiates the PPU to read PCBA via CNTR(15:0).

The PPU calculates an approximate phase error of previous $fr_{S2}$ versus $f_{F1}$, by subtracting from the newly read PCB, the number N of $f_{F1}$ clocks which nominally should correspond to the frame $fr_{S2}$.

When CTRB(14) goes high, the PCBB generates SEL14 signal. The SEL14 activates RST_PCBA which initiates PCBA reset circuits after its content has been read by PPU.

When $fr_{S2}$ rise occurs, PRESTOP_FF is set to 1 and inverts STOPA/STOPB signals.

When STOPB signal is active all the above functionality is fulfilled with reversed roles of STOPB and PCBA versus STOPA and PCBB.

High resolution extension of phase measurements is explained below.

The high resolution extension enhances phase detection resolution to a single inverter delay i.e. by ~10 times compared with conventional methods based on clock counting. The high resolution measurement is implemented in the HRPD Config.1, by using the phase capture register (PCR) to measure a positioning of the last rising edge of the second signal frame $fr_{S2}$ versus the $f_{F1}$ clock waveform The phase capture register captures a state of outputs of multiple serially connected gates which the first signal clock $f_{F1}$ is continuously propagated through, at the leading edge of the second signal frame $fr_{S2}$.

PCR decoders are used in the high resolution extension, and they are defined below.

The last rise decoder (LRD) provides binary encoded position of $f_{F1}$ rising edge, which has been captured at the most right location of the PCR.

The cycle length decoder (CLD) provides binary encoded lengths of the $f_{F1}$ wave, which has been captured between these 2 falling or 2 rising edges of the $f_{F1}$ wave which occurred at the most right locations of the PCR.

Captured PCR content is decoded by the last rise decoder and the cycle lengths decoder. Contents of the LRD and the CLD are later transferred to the phase processing unit (PPU).

The above operations are controlled by a Detector Timing Circuit, which is shown in the FIG. 1.

Timing analysis of the detector timing circuit is shown in FIG. 2 and is explained below.

The High Clock Region Flip-Flop (HCR_FF) is set to 1, when $f_{F1}$ rise encounters PCR(0) set to 1. The PCR(0) was set to 1, if an $fr_{S2}$ rise encountered $f_{F1}$=high. Therefore the HCR_FF=1 signals, that $fr_{S2}$ rising edge occurred during the $f_{F1}$=high halfcycle.

The PCR(1) is set to 1, when an $fr_{S2}$ rise encounters $f_{F1}$=low. Therefore the PCR(1)=1 signals, that $fr_{S2}$ rising edge occurred during the $f_{F1}$=low halfcycle.

PRESTOP_FF is set to 1, when $f_{F1}$ fall encounters HCR_FF or PCR(1) set to 1.

STOP_FF is reversed, by any rising edge of the PRESTOP_FF. Any STOP_FF switching causes a reversal of the PCBA/PCBB functions.

The whole PCR is reset by the signal PhaDet_RST. The PhaDet_RST shall be generated during $fr_{S2}$=low halfcycle and after contents of the PCR decoders are read by the phase processing unit.

It shall be noticed that a first $f_{F1}$ rise which occurs after $fr_{S2}$ rise, will encounter unchanged status of the STOP_FF. Therefore presently active counter will be increased by 1 by the first $f_{F1}$ rise, but it will be freezed when following $f_{F1}$ fall will reverse the STOP_FF before an arrival of the second $f_{F1}$ rise.

However since STOP_FF reversal was similarly delayed during previous $fr_{S2}$ measurement, presently active counter missed counting one $f_{F1}$ rise at the beginning of the present measurement.

Therefore the counter content needs to be decreased by 1, in order to represent a correct number of complete $f_{F1}$ cycles which occurred between consecutive rising edges of the $fr_{S2}$ frame.

Phase processing method combines the approximate phase measurement and the high resolution extension into an actual phase measurement of a frame signal.

The phase processing method uses additional terms which are explained below.

Calculated by PPU, measured phase (MEA_PHA) represents the actual phase error between $fr_{S2}$ versus the equivalent $f_{F1}$ frame; and consists of the listed below components.

LRD/CLD is a normalized value of a phase error between $fr_{S2}$ rise versus last $f_{F1}$ rise, as it has been read by the PPU from the LRD and CLD decoders.

Remaining phase error (REM_PHA) is calculated based on the present measurement results, but PPU stores and uses it to correct the next measurement result. The REM_PHA represents a remainder of a presently captured fraction of the $f_{F1}$ period, which needs to be added to the next phase error measurement.

Subtracted N which is a nominal number of first signal clocks per a second signal frame; transforms the counted number of $f_{F1}$ cycles per $fr_{S2}$ period, into an approximate phase error between the $fr_{S2}$ versus the $f_{F1}$.

While the LRD/CLD represents a normalized PCR captured extension of the CNTR(15:0) captured phase, and is added to the present MEA_PHA: the remaining phase error between the $fr_{S2}$ and the next $f_{F1}$ rise amounts to (CLD-LRD)/CLD and it is stored as the REM_PHA, in order to modify next measurement's MEA_PHA.

Therefore:

MEA_PHA=REM_PHA+CNTR-1+LRD/CLD-N, REM_PHA= (CLD-LRD)/CLD.

2. HRPD Config.2 based on ring oscillator captured by frame edge

For the approximate phase measurements the HRPD Config.2 uses the same circuits as the HRPD Config.1.

High resolution extension for the Config.2 has differences versus the Config.1, which are shown in the FIG. 3 and are listed below:

instead of using the open ended delay line as a first clock signal propagation circuit, the ring oscillator which generates $f_{F1}$ clock in the PLLxL Freq. Multiplier is used as said propagation circuit;

the cycle lengths decoder CLD is eliminated, because a number of active gates in the ring oscillator is known.

The phase capture register captures the state of outputs of multiple serially connected gates which form the ring oscillator which the first signal clock $f_{F1}$ is continuously propagated through, at the leading edge of the second signal frame $fr_{S2}$.

Since the ring oscillator gates must use lowered power supply, in order to allow their delays controllability in the PLL configuration: phase detection resolution will be slightly lower for the Config.2 versus the Config.1, but it still shall be significantly better when compared with conventional methods limited to clock counting.

The detector timing circuit and the timing analysis are the same for the Config.2 as for the Config.1 (see FIG. 1 and FIG. 2).

The only difference between a phase processing method of the Config.2 versus the Config.1 is: that since ring gates number (RGN) is always known, the Config.2 does not need to use the cycle lengths decoder and the CLD can be replaced by a ring gates number (RGN) in the equations calculating the MEA_PHA and the REM_PHA.

Therefore:

MEA_PHA=REM_PHA+CNTR-1+LRD/RGN-N, REM_PHA= (RGN-LRD)/RGN.

3. HRPD Config.3 based on clock signal captured by frame delay line edges.

For the approximate phase measurements the HRPD Config.3 uses the same circuits as the HRPD Config.1.

High resolution extension for the Config.3 has differences versus the Config.1, which are shown in the FIG. 4 and are listed below:

instead of propagating the $f_{F1}$ clock through a delay line, the second signal frame is propagated through the delay line, and outputs of the delay line gates are used to capture the $f_{F1}$ clock in corresponding bits of the phase capture register (PCR);

the first rise decoder (FRD) is used in the Config.3 instead of the last rise decoder (LRD) from the Config.1, since the PCR content represents $f_{F1}$ waveform occurring after a rising edge of the $fr_{S2}$ frame;

a new bit PCR(-1) is added to the PCR, in order to capture inverted $f_{F1}$ value which was captured in the PCR(1) bit for the Config.1.

Since non inverting gates must be used in the delay line, resolution is reduced compared with the Config.1, but still is significantly better than with conventional methods.

For the detector timing circuits, the HRPD Config.3 uses similar solutions as the HRPD Config.1: with the exception of using the signal PCR(-1) (see FIG. 5), instead of the signal PCR(1) (see FIG. 1) to enable activation of the PRESTOP_FF by the first falling edge of the $f_{F1}$.

The timing analysis is very similar for the Config.3 (see FIG. 6) as for the Config.1 (see FIG. 2). The differencies are caused by the fact that for the Config.3 parts of waveforms which occur after the rising edges of the frame signal are captured, and therefore the captured waveforms are shown on the right sides of the arrows indicating appearances of the frame rising edges.

Phase processing method for the Config.3 is explained below.

Since for the Config.3, the PCR and its decoders represent a part of a waveform which occurs after a frame rising edge:

a content of the FRD divided by the CLD, represents a REM_PHA value which shall be added to the next measurement, a fraction of the $f_{F1}$ cycle which shall be added to the present measurement amounts to:

1−FRD/CLD=(CLD−FRD)/CLD.

Therefore:

MEA_PHA=REM_PHA+CNTR−1+(CLD−FRD)/CLD−N, REM_PHA=FRD/CLD.

4. HRPD Config.4 based on frame delay line captured by clock signal.

For the approximate phase measurements the HRPD Config.4 uses the same circuits as the HRPD Config.1.

High resolution extension for the Config.4 has differences versus the Config.1, which are shown in the FIG. 7 and are explained below.

Instead of propagating the $f_{F1}$ clock through a delay line, the second signal frame is propagated through the delay line, and the outputs of the delay line gates are captured after any rising edge of the second signal frame:

the first $f_{F1}$ clock captures the frame delay line in the front phase capture register (FPCR);

the second $f_{F1}$ clock captures the frame delay line in the end phase capture register (EPCR).

A bit FPCR(−1) is used in the FPCR for capturing present value of the second signal frame $fr_{S2}$ by the falling edge of the first signal clock $f_{F1}$.

The last frame decoder (LFD) provides a binary encoded position of the $fr_{S2}$ rising edge versus the first following $f_{F1}$ rising, which has been captured on the right side of the FPCR.

The cycle length decoder (CLD) provides a binary encoded lengths of the $f_{F1}$ wave which is calculated as a difference between a number of gate delays captured in the EPCR versus a number of gate delays captured in the FPCR.

Detector Timing Circuit for the Config.4 has differences versus the Config.1, which are shown in the FIG. 8 and are explained below.

FPCR(−1) is used to activate the HCR_FF which enables activation of the PRESTOP_FF, if an $fr_{S2}$ rise occurred during $f_{F1}$=high condition.

FPCR(0) is used directly to enable activation of the PRESTOP_FF, if an $fr_{S2}$ rise occurred during $f_{F1}$=low condition.

An inverted PRESTOP_FF is used as active low STOPFN signal: in order to preserve the frame delay line captured in the FPCR by the first $f_{F1}$ clock after a rising edge of $fr_{S2}$. Normally all the rising edges of the $f_{F1}$ clock keep capturing the frame delay line in the FPCR, until the capturing is inhibited by STOPFN=low. Since STOPFN=low is generated between the first and the second $f_{F1}$ rise after the rising edge of $fr_{S2}$, the final content of the FPCR is the delay line captured by the first $f_{F1}$ rise.

Similarly an active low STOPEN signal is generated between the second and the third $f_{F1}$ rise after the rising edge of $fr_{S2}$. Since STOPEN=low inhibits further capturing of the frame delay line in the EPCR, the final content of the EPCR is the delay line captured by the second $f_{F1}$ rise.

Timing analysis for the Config.4 is shown in the FIG. 9.

The timing diagrams show both capture events: the delay line capturing by the first $f_{F1}$ rise, and the delay line capturing by the second $f_{F1}$ rise.

The FPCR(−1) is activated before the FPCR(0): if $fr_{S2}$ rise occurs during $f_{F1}$=high condition and is captured by $f_{F1}$ fall. Similarly the FPCR(0) is activated before the FPCR(−1): if $fr_{S2}$ rise occurs during $f_{F1}$=low condition and is captured by $f_{F1}$ rise.

The STOPFN is shown to be activated as STOPFN=low by the $f_{F1}$ fall after the first $f_{F1}$ rise. Similarly the STOPEN is shown to be activated as STOPEN=low by the $f_{F1}$ fall after the second $f_{F1}$ rise.

Phase processing method for the Config.4 is defined below.

LFD/CLD is a normalized value of a phase error between an $fr_{S2}$ rise versus the first $f_{F1}$ rise, as it has been read by PPU from the LFD and CLD decoders.

The content of the LFD divided by the CLD, represents a REM_PHA value which shall be added to the next measurement.

A fraction of the $f_{F1}$ cycle which shall be added to the present measurement amounts to:

1−LFD/CLD=(CLD−LFD)/CLD.

Therefore:

MEA_PHA=REM_PHA+CNTR−1+(CLD−LFD)/CLD−N, REM_PHA=LFD/CLD.

5. HRPD Config.5 based on frame captured by clock delay line.

For the approximate phase measurements the HRPD Config.5; uses the same circuits as the HRPD Config.1.

High resolution extension for the Config.5 has differences versus the Config.1, which are shown in FIG. 10 and are explained below.

The Config.5 implements said capture synchronization method:

by using the gates from G0 to GR to prevent the delay line outputs from capturing $fr_{S2}$=high into any PCR bit whenever the next PCR bit has been set to 1 before;

by using the delayed phase capture register (DPCR) to provide PCR content which is delayed by $f_{F1}$ halfcycle, in order to assure sufficient pulse duration for PCR input clocks.

For some integrated circuit technologies, PCR flip-flops propagation delays may be sufficient to provide said required pulse duration. Therefore for such technologies the DPCR is not needed, since an output of the next PCR bit can be connected directly to an inverter which prevents delay line output from passing through the gate connected to the clock input of the current PCR bit.

The outputs of the delay line gates which the $f_{F1}$ clock is propagated through, keep capturing 0s in the PCR for as long as the second signal frame remains low.

When a rising edge of the $fr_{S2}$ appears (see also FIG. 12):

the $fr_{S2}$ rise is captured in the PCR simultaneously by two rising edges of the delay line outputs, which are separated by a number of delay gates which corresponds to $f_{F1}$ cycle;

the two rising edges keep propagating along the delay line and keep capturing $fr_{S2}$=high in consecutive PCR bits for as long as encountered PCR bits have proceeding bits not set to 1;

in addition to said two rising edges, a third rising $f_{F1}$ edge enters the delay line from an $f_{F1}$ source and will keep propagating and capturing $fr_{S2}$=high until a bit is encountered which is proceeded by a set to 1 bit.

Therefore:

the first delay line rising edge will set all the bits starting from its $fr_{S2}$ detection bit down to the end of PCR;

the second delay line rising edge will set all the bits starting from its $fr_{S2}$ detection bit until it encounters the bit which follows the $fr_{S2}$ detection bit of the first line rising edge;

the third delay line rising edge will set all the bits starting from the delay line entry until it encounters the bit which follows the $fr_{S2}$ detection bit of the second line rising edge.

A bit PCR(-1) is used in the PCR for capturing present value of the second signal frame $fr_{S2}$, by the falling edge of the first signal clock $f_{F1}$.

First frame decoder (FFD) provides binary encoded position of the $fr_{S2}$ rising edge versus the last proceeding $f_{F1}$ rising which has been captured on the left side of the PCR as the $fr_{S2}$ detection bit of the second line rising edge.

Cycle length decoder (CLD) provides binary encoded lengths of the $f_{F1}$ wave, which is calculated as a number of gate delays between: the $fr_{S2}$ detection bit of the first line rising edge, and the $fr_{S2}$ detection bit of the second line rising edge.

Since non inverting gates must be used in the delay line, the resolution is reduced compared with the Config.1, but still is significantly better than with conventional methods.

Detector Timing Circuit for the Config.5 has differences versus the Config.1, which are shown in the FIG. 11 and are explained below.

PCR(-1) is used to activate the HCR_FF which enables PRESTOP_FF activation, if an $fr_{S2}$ rise occurred during $f_{F1}$=high condition.

PCR(0) directly enables PRESTOP_FF activation, , if an $fr_{S2}$ rise occurred during $f_{F1}$=low condition.

Phase processing method for the Config.5 is explained below.

FFD/CLD is a normalized value of a phase error between an $fr_{S2}$ rise versus the last $f_{F1}$ rise, as it has been read by the PPU from the FFD and the CLD decoders.

The content of the FFD divided by the CLD shall be added to the present phase measurement.

A fraction of the $f_{F1}$ cycle which shall be added to the next measurement amounts to:

1-FFD/CLD=(CLD-FFD)/CLD.

Therefore:

MEA_PHA=REM_PHA+CNTR-1+FFD/CLD-N, REM_PHA= (CLD-FFD)/CLD.

6. HRPD Config.6 based on frame captured by ring oscillator.

For the approximate phase measurements, the HRPD Config.6 uses the same circuits as the HRPD Config.5.

High resolution extension for the Config.6 has differences versus the Config.5, which are shown in the FIG. 13 and FIG. 14 and are explained below.

Instead of the open ended delay line, the outputs of the ring oscillator which is phase locked to a stable clock, are used to capture a rise of the $fr_{S2}$ signal in the PCR.

Since the number of ring oscillator gates and the $f_{F1}$ clock period are known, a calibration of the gates propagation delays is not needed for the HRPD Config.6, and the CLD is not needed as well.

Since the calibration is not needed, and the oscillator gates delays cover all the $f_{F1}$ clock period; the PCR can be much shorter, as it needs to cover only one $f_{F1}$ clock period.

The Config.6 uses PLLxL Freq. Multiplier to provide the ring oscillator which is phase locked to a stable reference clock. Therefore ring oscillator gates are the serially connected gates which the $f_{F1}$ is propagated through, and are used to capture a rise of the second signal frame. The ring oscillator gates must use lower power supply in order to allow their delays controllability in the PLL configuration.

Therefore, resolution is slightly reduced compared with the Config.5, but still is significantly better than with conventional methods.

The detector timing circuit is the same for the Config.6 as for the Config.5.

The timing analysis is very similar for the Config.6 as for the Config.5. The only difference is that the PCR content is much shorter, since only one $f_{F1}$ clock period needs to be captured.

The only difference between the phase processing method of the Config.6 versus the Config.5 is: that since ring gates number (RGN) is always known, the Config.6 does not need to use the cycle lengths decoder and the CLD can be replaced by the RGN in the equations calculating the MEA_PHA and the REM_PHA.

Therefore:

MEA_PHA=REM_PHA+CNTR-1+FFD/RGN-N REM_PHA= (RGN-FFD)/RGN

What is claimed is:

1. A digital phase detector for measuring a phase skew between a first signal frame consisting of a nominal number of first signal clocks and a second signal frame, wherein:

a frame measurement configuration is used for counting the first signal clock during every frame of a second signal, and for buffering the counted value until it is read by a phase processing unit;

a subtracting circuit is used for subtracting the nominal number of first signal clocks from the counted number of the first signal clocks, in order to calculate an approximate phase skew between the first signal frame and the second signal frame.

2. A digital phase detector as claimed in claim 1, wherein:

said subtracting circuit presets a counter of the first signal clocks to zero minus the nominal number of first signal clocks before the first clock counting for every second signal frame.

3. A digital phase detector as claimed in claim 1, further comprising:

a phase capture register for capturing a state of outputs of serially connected gates which the first signal clock is propagated through, at the leading edge of the second signal frame.

4. A digital phase detector as claimed in claim 1, further comprising:

a phase capture register for capturing a rise of the second signal frame by multiple outputs of serially connected gates which the first signal clock is propagated through.

5. A digital phase detector as claimed in claim 1, further comprising:

a phase capture register for capturing a state of outputs of serially connected gates which the second signal frame is propagated through, by the leading edge of the first signal clock.

6. A digital phase detector as claimed in claim 1, further comprising:

a phase capture register for capturing a rise of the first signal clock, by multiple outputs of serially connected gates which the second signal frame is propagated through.

7. A digital phase detector as claimed in claim 3 or in claim 4 or in claim 5 or in claim 6, wherein the digital phase detector comprises:

an open ended line of serially connected components which are used as the serially connected gates.

8. A digital phase detector as claimed in claim 7, wherein the digital phase detector comprises a calibration method of gates propagation delays, wherein:

a number of the serially connected gates which represents a number of half cycle times of the first signal clock, is captured in the phase capture register;

the number of half cycle times of the first signal clock, is divided by the captured number.

9. A digital phase detector as claimed in claim 8, wherein the calibration method comprises:

a statistical averaging of a result of the calibration, in order to eliminate most of a granularity error caused by capturing of an integer and to reduce an error caused by a power supply ripple.

10. A digital phase detector as claimed in claim 9, wherein the calibration method further comprises:
assigning higher weights for the captured number of gates, if the captured number is provided by serially connected gates which are located at the front of the delay line;
using the weighted cycle gate numbers for the statistical averaging of the calibration result.

11. A digital phase detector as claimed in claim 3 or in claim 4 or in claim 5 or in claim 6, wherein the digital phase detector comprises:
a ring oscillator which gates are used as the serially connected gates.

12. A digital phase detector as claimed in claim 3 or in claim 4 or in claim 5 or in claim 6, wherein the digital phase detector comprises:
a delay locked loop which gates are used as the serially connected gates.

13. A digital phase detector as claimed in claim 3 or in claim 4 or in claim 5 or in claim 6, wherein:
a content of the phase capture register is used to calculate a phase skew difference between the last rise of the first signal clock and the beginning of a new second signal frame;
a content of the phase capture register is used to calculate a remaining phase skew between the beginning of a new second signal frame and the first rise of the first signal clock.

14. A digital phase detector as claimed in claim 13, wherein:
the phase skew difference is added to the present measurement of a phase skew between the first signal and the second signal, wherein the present measurement applies to the present frame period of the second signal;
the remaining phase skew is added to the next measurement of a phase skew between the first signal and the second signal, wherein the next measurement applies to the next frame period of the second signal.

15. A digital phase detector as claimed in claim 13, wherein:
the remaining phase skew is calculated as equal to the first signal clock period minus the phase skew difference.

16. A digital phase detector as claimed in claim 13, wherein:
a content of the phase capture register is used to upgrade the counted number of first signal clocks to an actual number of first signal clocks which really occurred during the second signal frame.

17. A digital phase detector as claimed in claim 3 or in claim 4 or in claim 5 or in claim 6, wherein the digital phase detector comprises:
a first phase counter buffer for counting first signal clocks during every odd cycle of the second signal frame, and for buffering the counted clocks number during every following even cycle of the second signal frame;
a second phase counter buffer for counting first signal clocks during every even cycle of the second signal frame, and for buffering the counted clocks number during every following odd cycle of the second frame;
a detector timing circuit for switching the counting and the buffering functions of the first and the second phase counter buffer.

18. A digital phase detector as claimed in claim 17, wherein:
the switching performed by the detector timing circuits is driven by the first signal clock and is conditioned by a content of the phase capture register.

19. A digital phase detector as claimed in claim 17, wherein:
the phase capture register and some of the flip-flops of the detector timing control, are reset outside of a close time range which surrounds a rising edge of every second signal frame.

20. A digital phase detector as claimed in claim 17, wherein:
if a rising edge of the second signal frame encounters a high level of the first signal clock, the second falling edge of the first signal clock will reverse the counting and the buffering functions of the first and the second phase counter buffer;
if a rising edge of the second signal frame encounters a low level of the first signal clock, the first falling edge of the first signal clock will reverse the counting and the buffering functions of the first and the second phase counter buffer.

21. A digital phase detector as claimed in claim 17, wherein the detector timing circuit comprises a function switching flip-flop, wherein:
the function switching flip-flop switched to 1, inhibits counting in the first counter buffer and enables counting in the second counter buffer;
the function switching flip-flop switched to 0, inhibits counting in the second counter buffer and enables counting in the first counter buffer.

22. A digital phase detector as claimed in claim 1, the digital phase detector comprising:
a first phase counter buffer for counting first signal clocks during every odd cycle of the second signal frame, and for buffering the counted clocks number during every following even cycle of the second signal frame;
a second phase counter buffer for counting first signal clocks during every even cycle of the second signal frame, and for buffering the counted clocks number during every following odd cycle of the second frame.

23. A digital phase detector as claimed in claim 22, wherein the digital phase detector comprises:
a detector timing circuit for controlling the counting and the buffering functions of the first and the second phase counter buffers.

24. A digital phase detector as claimed in claim 22, wherein said detector timing circuit further comprises:
detection of a beginning of a cycle of the second signal frame;
switching the counter buffers into the counting and buffering operations;
requesting the phase processing unit to read the buffered count numbers.

25. A digital phase detector as claimed in claim 22, wherein:
the first counter buffer is reset after its content is read by a phase processing unit;
the second counter buffer is reset after its content is read by the phase processing unit.

26. A digital phase detector as claimed in claim 22, wherein:
the first counter buffer is preset to zero minus the nominal number of first signal clocks, after its content is read by the phase processing unit;

the second counter buffer is preset to zero minus the nominal number of first signal clocks, after its content is read by the phase processing unit.

27. A digital phase detector as claimed in claim 22, wherein the digital phase detector further comprises:
a detector timing circuit for switching the counting and the buffering functions of the first and the second phase counter buffer.

28. A digital phase detector as claimed in claim 27, wherein the detector timing circuit further comprises a function switching flip-flop, wherein:
the function switching flip-flop switched to 1, inhibits counting in the first counter buffer and enables counting in the second counter buffer;
the function switching flip-flop switched to 0, inhibits counting in the second counter buffer and enables counting in the first counter buffer.

29. A digital phase detector as claimed in claim 28, wherein the digital phase detector further comprises:
a phase capture register for capturing a state of outputs of serially connected gates which the first signal clock is propagated through, at the leading edge of the second signal frame;
an open ended line of serially connected components which are used as the serially connected gates.

30. A digital phase detector as claimed in claim 28, wherein the digital phase detector further comprises:
a phase capture register for capturing a state of outputs of serially connected gates which the first signal clock is propagated through, at the leading edge of the second signal frame;
a ring oscillator which gates are used as the serially connected gates.

31. A digital phase detector as claimed in claim 28, wherein the digital phase detector further comprises:
a phase capture register for capturing a rise of the first signal clock, by multiple outputs of serially connected gates which the second signal frame is propagated through;
an open ended line of serially connected components which are used as the serially connected gates.

32. A digital phase detector as claimed in claim 28, wherein the digital phase detector further comprises:
a phase capture register for capturing a state of outputs of serially connected gates which the second signal frame is propagated through, by the leading edge of the first signal clock;
an open ended line of serially connected components which are used as the serially connected gates.

33. A digital phase detector as claimed in claim 28, wherein the digital phase detector further comprises:
a phase capture register for capturing a rise of the second signal frame by multiple outputs of serially connected gates which the first signal clock is propagated through;
an open ended line of serially connected components which are used as the serially connected gates.

34. A digital phase detector as claimed in claim 28, wherein the digital phase detector further comprises:
a phase capture register for capturing a rise of the second signal frame by multiple outputs of serially connected gates which the first signal clock is propagated through;
a ring oscillator which gates are used as the serially connected gates.

35. A digital phase detector as claimed in claim 29 or in claim 30 or in claim 31 or in claim 32 or in claim 33 or in claim 34, wherein:
a content of the phase capture register is used to calculate a phase skew difference between the last rise of the first signal clock and the beginning of a new second signal frame;
a content of the phase capture register is used to calculate a remaining phase skew between the beginning of a new second signal frame and the first rise of the first signal clock;
a high resolution extension is calculated by adding the remaining phase skew of the previous measurement to the phase skew difference of the present measurement;
a high resolution frame skew is calculated by adding the approximate frame skew to the high resolution extension.

36. A digital phase detector as claimed in claim 29 or in claim 30, wherein:
bit 0 of the phase capture register is set to 1, if a rising edge of the second signal frame encounters a high level of the first signal clock;
bit 1 of the phase capture register is set to 1, if a rising edge of the second signal frame encounters a low level of the first signal clock;
if the bit 0 is set to 1, it enables a second falling edge of the first signal clock to reverse the function switching flip-flop;
if the bit 1 is set to 1, it enables a first falling edge of the first signal clock to reverse the function switching flip-flop.

37. A digital phase detector as claimed in claim 31, wherein:
bit 0 of the phase capture register is set to 1, if a rising edge of the second signal fame encounters a high level of the first signal clock;
bit −1 of the phase capture register is set to 1, if a rising edge of the second signal frame encounters a low level of the first signal clock;
if the bit 0 is set to 1, it enables a second falling edge of the first signal clock to reverse the function switching flip-flop;
if the bit −1 is set to 1, it enables a first falling edge of the first signal clock to reverse the function switching flip-flop.

38. A digital phase detector as claimed in claim 32 or in claim 33 or in claim 34, wherein:
bit −1 of the phase capture register is set to 1, if a falling edge of the first signal clock encounters a high level of the second signal frame before a rising edge of the first signal clock does;
bit 0 of the phase capture register is set to 1, if a rising edge of the first signal clock encounters a high level of the second signal frame before a falling edge of the first signal clock does;
if the bit −1 is set to 1, it enables a second falling edge of the first signal clock to reverse the function switching flip-flop;
if the bit 0 is set to 1, it enables a first falling edge of the first signal clock to reverse the function switching flip-flop.

39. A digital phase detector as claimed in claim 1, wherein:
said first clock counting is enabled by opening a logical gate which controls an application of the first clock to a clocking input of a first clock counter;
said first clock counting is disabled by closing a logical gate which controls an application of the first clock to the clocking input of the first clock counter.

* * * * *